(12) United States Patent
Cugini et al.

(10) Patent No.: US 11,665,871 B2
(45) Date of Patent: May 30, 2023

(54) ELECTROMAGNETIC PULSE RESISTANT DEVICE CASING

(71) Applicant: Noah Systems LLC, Vista, CA (US)

(72) Inventors: Mario Alfredo Cugini, Vista, CA (US); Thomas Joseph Horner, Vista, CA (US)

(73) Assignee: Noah Systems LLC, Vista, CA (US)

( * ) Notice: Subject to any disclaimer, the term of this patent is extended or adjusted under 35 U.S.C. 154(b) by 0 days.

(21) Appl. No.: 15/714,962

(22) Filed: Sep. 25, 2017

(65) Prior Publication Data

US 2019/0098801 A1 Mar. 28, 2019

(51) Int. Cl.
| | | |
|---|---|---|
| *H05K 9/00* | (2006.01) | |
| *F21V 15/01* | (2006.01) | |
| *F21L 4/00* | (2006.01) | |
| *F21V 23/04* | (2006.01) | |

(52) U.S. Cl.
CPC ............ *H05K 9/0009* (2013.01); *F21L 4/005* (2013.01); *F21V 15/01* (2013.01); *H05K 9/005* (2013.01); *H05K 9/0049* (2013.01); *H05K 9/0058* (2013.01); *F21V 23/0421* (2013.01); *H05K 9/0066* (2013.01)

(58) Field of Classification Search
CPC .... H05K 9/0009; H05K 9/0049; H05K 9/005; H05K 9/0058; H05K 9/0066; F21L 4/005; F21V 15/01; F21V 23/0421
See application file for complete search history.

(56) References Cited

U.S. PATENT DOCUMENTS

| | | | | |
|---|---|---|---|---|
| 5,296,647 | A * | 3/1994 | Banker ................... | H02G 3/123 174/58 |
| 6,313,400 | B1 * | 11/2001 | Mosquera .............. | H05K 5/026 174/363 |
| 7,247,791 | B2 * | 7/2007 | Kulpa ..................... | G06F 21/87 174/17 R |
| 2008/0165517 | A1 * | 7/2008 | Wang ..................... | H05K 1/144 361/784 |
| 2012/0243199 | A1 * | 9/2012 | Wu ........................ | H01L 23/552 361/818 |

* cited by examiner

*Primary Examiner* — Pete T Lee
(74) *Attorney, Agent, or Firm* — CP Law Group PC; Cy Bates

(57) ABSTRACT

An EMP-resistant (electromagnetic pulse-resistant) case for portable electronic devices is provided. The case includes a conductive external housing configured to enclose the electronic device. The housing includes a lower housing having a continuous connection surface. The housing also includes an upper housing having a continuous connection surface. The lower and upper housing are configured to releasably engage at the continuous connection surface. The housing includes a conductive gasket positioned at the continuous connection surface between the upper and lower housing. The case also includes a first insulative layer at least partially covering the inside surface of the upper and lower housing.

10 Claims, 14 Drawing Sheets

ELECTROMAGNETIC PULSE RESISTANT DEVICE CASING

BACKGROUND

1. Field of Invention

The present invention relates to the field of electromagnetic-pulse or other electromagnetic attack resistant cases and housings for electronic devices.

2. Description of Related Art

Our world is increasingly dependent on electronic devices, which provide our connection to other people and economic activity. However, there is a fear of electronic devices and systems being destroyed by electromagnetic pulses. As circuit components continue to shrink in size and increase in complexity, and with the evolution of Very-Large-Scale-Integrated devices (VLSI), these components are part of almost every electronic based item. There is ample history and evidence about what an EMP can do to electrical systems and electronics. Small and simple electronics can experience a surge that burns out VLSI (and other silicon based components) and can cause the devices to malfunction. This risk of disablement may be present with larger devices as well, such as computer systems and network devices.

A graph showing the breakdown of the various EMP signals is included as FIG. 1. While there are several types or levels of EMP that may affect electronic devices. An EMP can be represented as a very short pulse of 5-10 ns duration. This will create the initial damage to electronic components. In an EMP this is known as E1. Subsequently, A pulse of 10-100 μs duration that resembles lighting will finish destroying items previously damaged by E1. In an EMP this is known as E2. By itself, and not part of an EMP, a similar pulse to this one can be created by people with technical knowledge, and will cause a similar effect;

There are natural forms of EMP as well as man-made. Natural forms include solar flares (coronal mass ejection), meteor strikes and lightning strikes. High Rise buildings are equipped with lightning rods to prevent electrical systems and electronic items like refrigerators, TVs, telephones from being harmed by their impact, and solar flares typically do not have enough power to affect our daily lives.

Man-made EMPs tend to be of two types. EMPs are generated as a byproduct of a nuclear detonation within or above the atmosphere, wherein gamma rays ionize atoms in the atmosphere. As they come down to earth, they reach ground level with powers in the 150 keV range. This is enough to destroy most electronic equipment. A nuclear bomb detonated 300 miles above the earth and centered around the middle of the USA, could destroy an area as large as the USA, plus most of Mexico and Canada.

The second type of man-made EMP generator is a device/system with the capability of creating a high voltage pulse of short duration, which has a shorter range of impact, but has the same effects. Such a system can be easily placed in the back of a pick-up truck, and from a distance of 100 yards, it can destroy the electronics inside a building. The EMP pulse generator may also be aimed. As an example of properly aimed, s perpetrator can shut down a police station, and simply drive away to its next target while the Police are trying to figure out why they lost power. A host of such devices, with different degrees of power emission, are accessible to anyone with Internet and a mailing address. With current costs estimated to range between US$10,000 and US$150,000 they can be acquired by a broad range of individuals. There is enough information online so that they can be assembled by low to medium skilled technical people.

A coordinated attack may disable emergency responders, and eliminate the ability for Police (or other similar services) to protect people. As a result, international borders will become unprotected. Looting and other social mayhem will likely ensue, as has been experienced during riots and other such events where the police could not respond fast enough because they were busy assisting elsewhere. With the lights and power out, nighttime in cities may result in physical violence as a result of the lack of accountability. Surveillance cameras would no longer work.

By providing first responders with a solution that is not affected by such attacks, they will be able to function, defend themselves, and assist the people they are meant to protect. If a protected device can continue to function during and after an EMP, it remains unaffected by the EMP threat. This threat has been removed as a means to incapacitate first responders and destroy devices. Those that have been protected will continue to function. Therefore, there is a need to protect electronic devices from EMP. Other names for EMP are HEMP (High Altitude EMP), NEMP (Nuclear EMP), or NNEMP (Non-Nuclear EMP)

SUMMARY

An EMP-resistant (electromagnetic pulse-resistant) case for portable electronic devices is provided. The case includes a conductive external housing configured to enclose the electronic device. The housing includes a lower housing having a continuous connection surface. The housing also includes an upper housing having a continuous connection surface. The lower and upper housing are configured to releasably engage at the continuous connection surface. The housing includes a conductive gasket positioned at the continuous connection surface between the upper and lower housing. The case also includes a first insulative layer at least partially covering the inside surface of the upper and lower housing.

The foregoing, and other features and advantages of the invention, will be apparent from the following, more particular description of the preferred embodiments of the invention, the accompanying drawings, and the claims.

BRIEF DESCRIPTION OF THE DRAWINGS

For a more complete understanding of the present invention, the objects and advantages thereof, reference is now made to the ensuing descriptions taken in connection with the accompanying drawings briefly described as follows.

DETAILED DESCRIPTION

Figure 1:
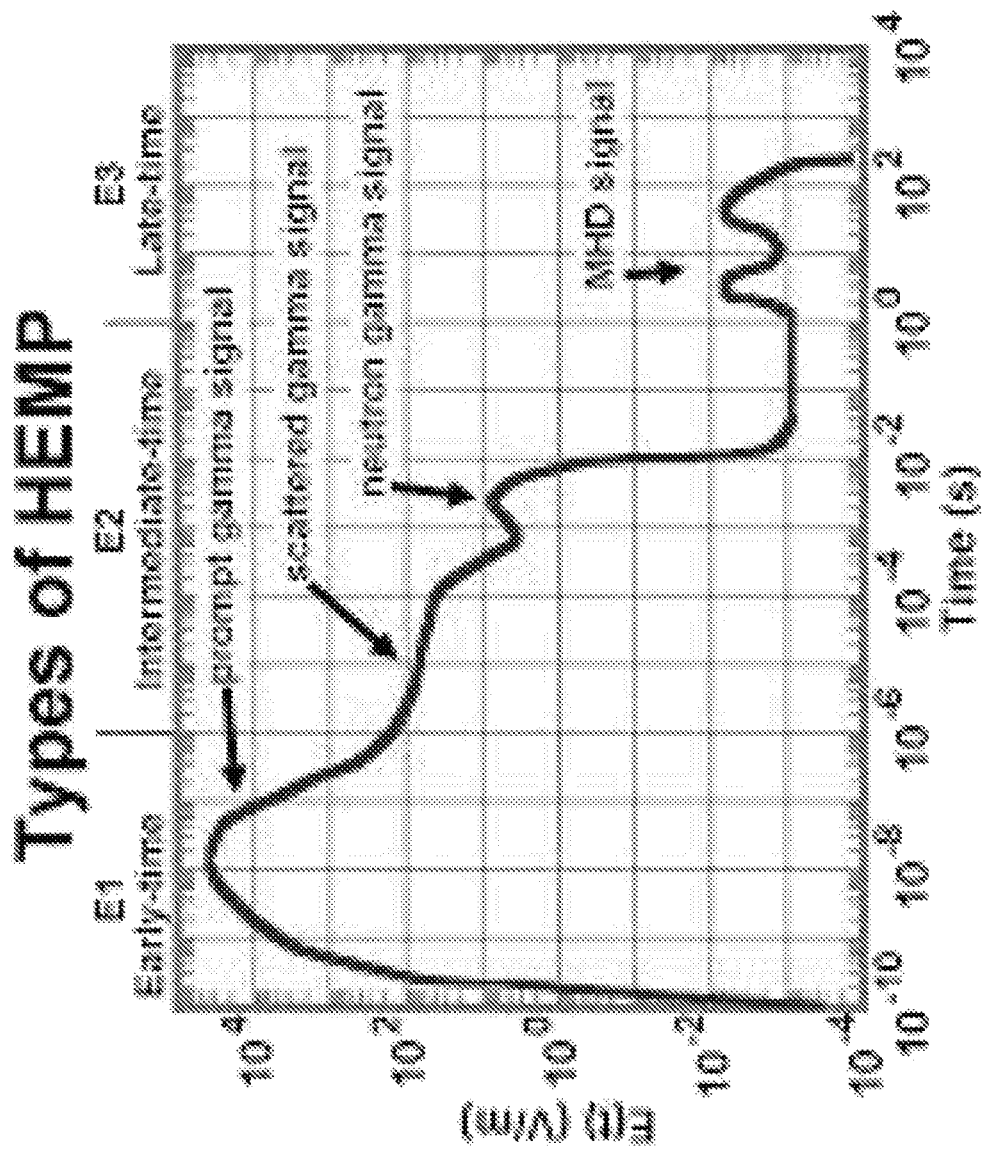
FIG. 1 shows the waveform and phases of a typical EMP, as historically reported.

Embodiments of the present invention and their advantages may be understood by referring to FIGS. 1-14, wherein like reference numerals refer to like elements.

The described solution is one with multiple protection steps against an EMP. In an embodiment the container has a completely conductive outer shell, which may or may not be covered or coated in plastic on its exterior. The container may have a metallic body with specially conductive gaskets, where pieces need to separate. In an embodiment, there is also a fine mesh to block the high frequency, and permit the light to pass.

For some embodiments, a second (internal) layer is required. The second layer includes a second conductive layer, and a second insulative layer. The second layer must also be insulated from the outer layer, perhaps with an outer insulative layer on the interior of the exterior housing. In an embodiment, there may be a second mesh around an LED, to permit the light to pass while maintaining separation of the layers. In an embodiment, there may also be a third innermost layer, including a third conductive layer and a third insulative layer. In an embodiment, the third layer does not completely cover the inside. Embodiments may also have an additional level of protection using thyristors, around the sensitive electronic points (semiconductors) like the LED and Power areas (like the battery).

With reference to FIG. 1, an EMP is characterized as a pulse made up of three portions. In an example, it starts with a very high power 5-10 nanosecond pulse (known as E1) that can reach an excess of 150,000 Volts/meter. Its effect is to damage most electronic devices by inducing its energy into them. E1 is followed by E2, a 10-100 micro second pulse of lower energy, similar to the shock of lightning strike. Although lower in power, it does damage to electronic devices by overloading circuits and burning out connections. E3 will last 1-100 seconds and it affects the magnetic field all around it. As an analogy, it would be similar to jumping on a water bed, wherein the first thing that happens is that the water will move away, to make room for the new volume introduced. After this, the water returns, pushing up on the volume.

As a simple analogy to insulating against an EMP pulse, imagine looking out of a room, through a normal two-pane (outer and inner) glass window, during a hot summer afternoon, and you want to stop the heat from coming in through the window. If you go outside, you will feel the full effect of the temperature. If you proceed to touch the outside of the window, it will feel very hot. This is because the outer pane is absorbing part of the heat and solar rays. While one cannot feel it, the outdoor face of the outer glass will be hotter than the inner one. The outer pane can only block a portion of the total heat that the window is exposed to. The remainder of heat proceeds to the inner glass pane, and the process repeats itself, where a portion of the remaining heat is absorbed by the inner glass pane. The internal face of the inner glass plane will be the coolest. If one had a triple pane glass window, one more cycle of absorption and transmission would take place, with the main impact being that of attenuating the heat that reaches the interior of a room.

Something very similar happens when an EMP reaches the metallic surface of an electronic device/instrument. Consider first a fully enclosed and fully sealed box; as the EMP energy reaches it, and passes into/through it, some of it is absorbed, yet some passes through it to the next barrier or object. Insulators and subsequent metallic plates will function much in the same manner as the heat through the glass window.

Unfortunately, in the case of an EMP, a much more complex additional behavior is at work. As the EMP reaches the first surface and penetrates it, the electric field generates eddy currents which shift the protection requirement from mainly electric, to both electric and magnetic. This means that what passes through the first layer (while lower in overall intensity) is different from what entered. Therefore, choices for any subsequent layers or materials must be optimized to absorb a different type of energy than the previous ones, based on the effect of the previous layers on the energy.

In some embodiments, the specific configuration (materials and thicknesses) of the protective layers will abate enough of the EMP, so that by the time the energy reaches the circuit boards and electronic components, it is too weak to cause damage. Solutions can be created with increasing levels or layers of defense to arrive to a maximum level of protection.

Basic Protection

Devices like flashlights and lantern-like devices cannot be built with fully metallic surfaces, or the light would not be able to get out. There are generally apertures covered with glass or plastic to permit the emanation of the light. A power switch cover faces the same challenges. Other electronic devices require openings for signals or sensors to receive information, for example.

A fully enclosed and sealed metallic housing has metallically sealed covers over switches, and micro mesh of stainless steel or copper to block high frequency signals can be used. In one embodiment, a high transparency conductive mesh of 50×50 openings per inch was used. The wire diameter must be large enough to absorb the energy passing through it. Switch covers and other openings must be protected by covering them with a conductive path. In one embodiment, the micro mesh used was stainless steel. Copper and many other materials or clear conductive coatings can also be used. In each of these examples, this provides a mesh of adequate density, but other levels of mesh density may be sufficient.

Any portions that need to be separated (for example light head from the flashlight body), to replace batteries, or any other routine/maintenance tasks, need to maintain complete seal after re-closure. The closure may be sealed by use of adequately performing gaskets. In one embodiment, a BeCu gasket is used. Others like stainless steel or special conductive elastomers may also be implemented if housing material is of a type to be of type to absorb or block the maximum electromagnetic field it is exposed to. In one embodiment, Aluminum 6061 was used to absorb the EMP energy.

Intermediate Protection

An internal fully enclosed and sealed metallic second housing is insulated from the outer housing by non-conductive insulator material. In one embodiment, plastic was used, and in another, heat shrink material. A variety of other insulators can be implemented for this purpose. This internal second housing material will absorb whatever amount of electro-magnetic field has managed to either penetrate the outer housing, or is simply induced from it. The second housing is preferably made of a selected metal that can better absorb the type of electromagnetic field it is exposed to. In one embodiment, stainless steel was used. Alternatively, some Aluminum, Copper, alloys, or other materials could be implemented as well. Any openings or apertures, like an LED port, must be protected by a micro mesh cover of stainless steel or copper, similar to mesh listed above as part of an outer housing, for example.

Advanced Protection

In an embodiment, a third inner layer, fully insulated from the second housing or layer by an insulator, will absorb any remaining electromagnetic energy that penetrates past the first two layers or housings (outer housing and second housing). Validation of performance can be achieved by testing the embodiment to the well-known MIL-STD-461, RS 105. Note that these tests have been traditionally performed on Military Vehicles, ships, airplanes, and other ground based instrumentation.

Electronic Susceptibility and Protection

Figure 7:
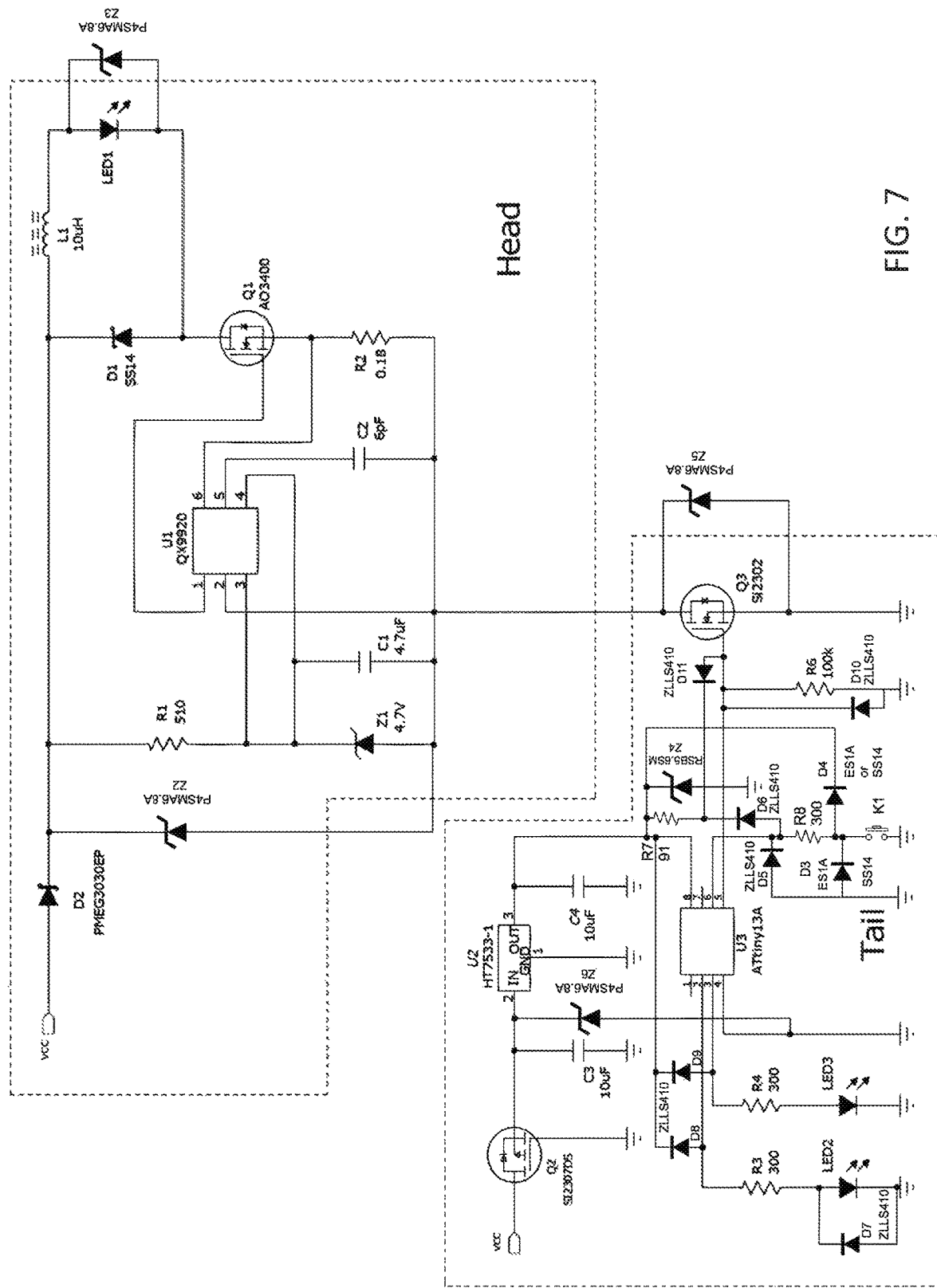
FIG. 7 is a circuit diagram of an EMP-protected device, according to an embodiment.

Batteries (not shown), integrated circuits, and semiconductor type components like LED lights can be protected by adding transient voltage-suppression (TVS) diodes or thyristors (e.g. Transzorbs), diodes, and capacitors, to clamp any voltage spikes induced, which could cause damage to other semiconductors, and provide a drainage path for the energy introduced. TVS Diodes operate by shunting excess current when the induced voltage exceeds the avalanche breakdown potential. This provides a clamping device, potentially suppressing all over-voltages above its breakdown voltage. Typically, these devices are placed around the components that would be most affected. FIG. 7 shows these protection devices highlighted in an embodiment.

Figure 2:
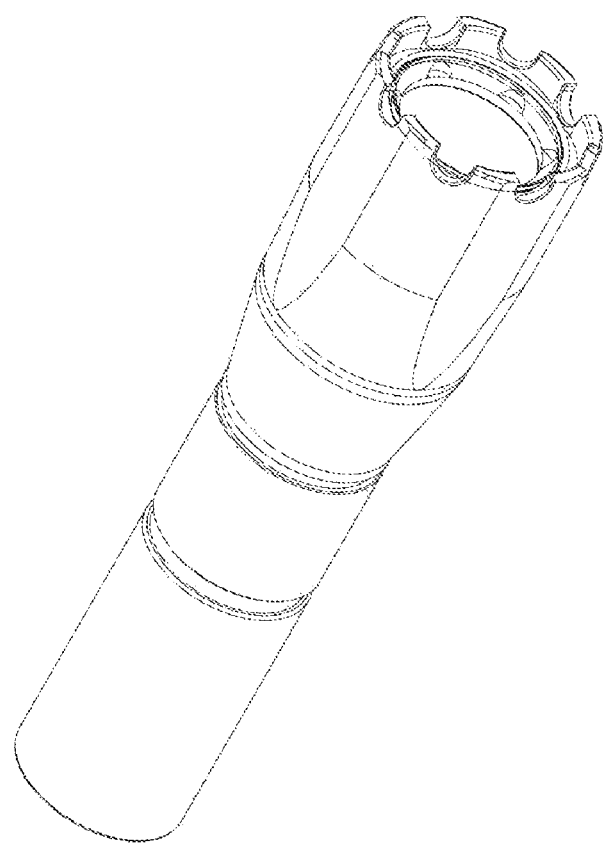
FIG. 2 is an external view of an EMP-protected flashlight, according to an embodiment.

With reference to FIG. 2, an exterior 3 of an EMP-protected flashlight is shown. The first external layer or housing may be seen, as well as the lens glass protecting the light source. At first inspection, a protected flashlight will look very similar to a normal flashlight. Careful examination of the lens in front of the light emission area will be required to determine the difference, in that the mesh is apparent in front of, or within, the lens, as part of the outer layer.

Figure 3:
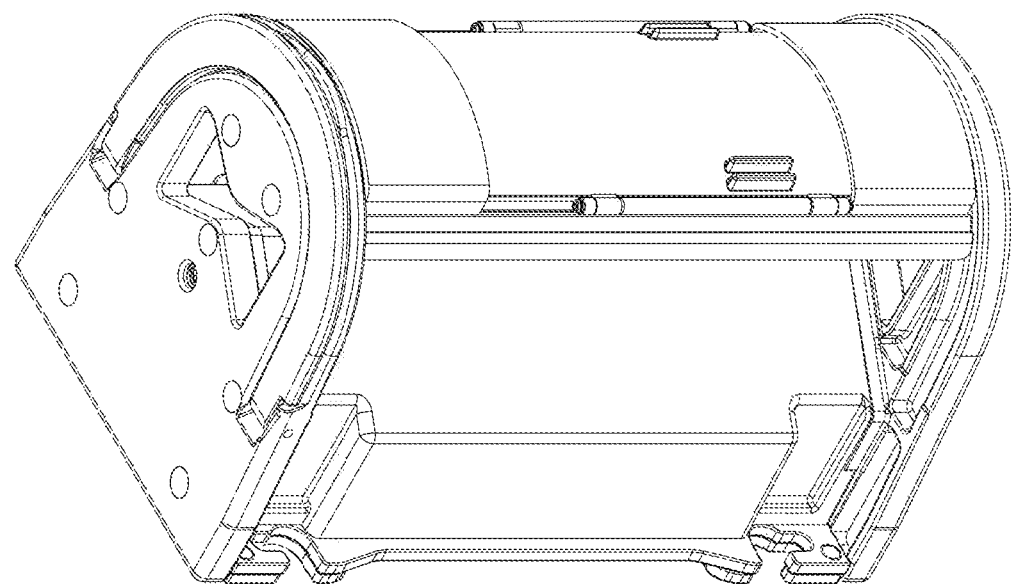
FIG. 3 is an external view of a protected lantern, according to an embodiment.

With reference to FIG. 3, an exterior 4 of an EMP-protected lantern is shown. At first inspection, a protected lantern will look very similar to a normal lantern. Careful examination of the lens glass in front of the light emission area will be required to see the difference, in that the first layer of wire mesh passes in front of or behind the lens, as part of the outer housing or layer, described in further detail below.

Figure 4:
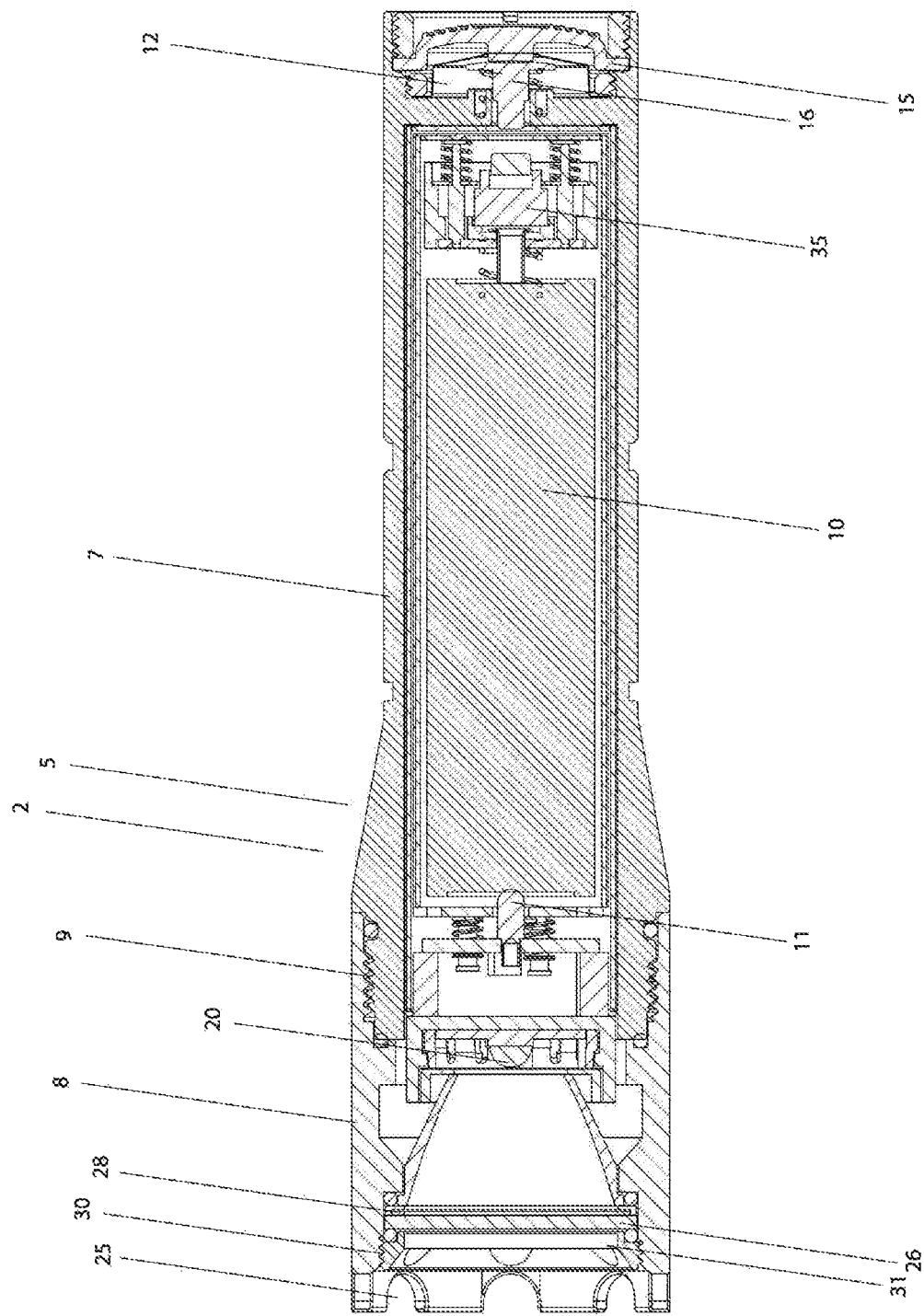
FIG. 4 is cross section of an EMP-protected device, according to an embodiment.

With reference to FIG. 4, a cross-section of an EMP-protected electronic device 2 is shown in this embodiment, a flashlight. The device has an external housing 5 around the device components, the external housing 5 includes a lower housing 7 and upper housing 8, which are in threaded engagement with one another at a continuous connection surface 9, as well as a rear barrier 12 across the bottom and a mesh disk 28 electrically closing off the top, also threadedly-engaged with the other components of the exterior housing. The housing 5 seals off the interior components of the device from the exterior. For example, the housing continues across the rear of the device to create a rear barrier seal 12, wherein a power button rubber cover 15 is located. Plastic plunger 16 connects to the inside via a hole in the housing, and contacts the switch 35. The upper housing 8 contains the light source unit 20. As can be appreciated, the light source 20 provides light that emanates through the upper housing 8 to enable to flashlight to be useful, therefore the upper housing 8 has a hollow interior therein to house the light source 20, with an opening 25 to permit the emission of light from the front of the device. The hollow interior contains the light source 20 and has threaded walls 30 at the opening 25, and is closed by a tightening ring/bezel 31, glass or plastic lens 26, as well as a mesh disk 28 that is removably affixed into the aperture by engaging with threading 30. Each threaded continuous connection surface provides an electrical connection between the threadedly-engaged pieces. Therefore, the exterior housing 5 creates an electrically-connected barrier, between the combination of the lower housing 7, the upper housing 8, the rear barrier 12, and the mesh disk 28, wherein current may flow freely between these portions.

The device 2 has a battery 10 therein, and a switch 35 mechanically or electrically connected to a power button 15 at the rear of the device. The battery 10 is also electrically connected to the light source 20 through the switch and contact 11, such that when the device is switched on, current is provided from the battery 10 to the light source, so as to provide light from the front of the device 2.

The components making up the exterior housing 5 are composed of electrically conductive materials, that are electrically engaged with one another, so as to be able to pass sudden current surges. A mesh layer 28 is composed of a mesh of stainless steel (or other conductor), electrically connected throughout the mesh, without substantial gaps, but insulated from the electrical components of the device. Without limiting the potential embodiments, in an embodiment, the outer mesh layer 28 may include stainless steel mesh at 50×50 openings per square inch, with an opening size of 0.0188 in, and wherein the overall thickness is 0.0024 in, given an open area percentage of 88% which does not significantly diminish emanating light. This outer mesh layer is conductive to the exterior housing.

Figure 5:
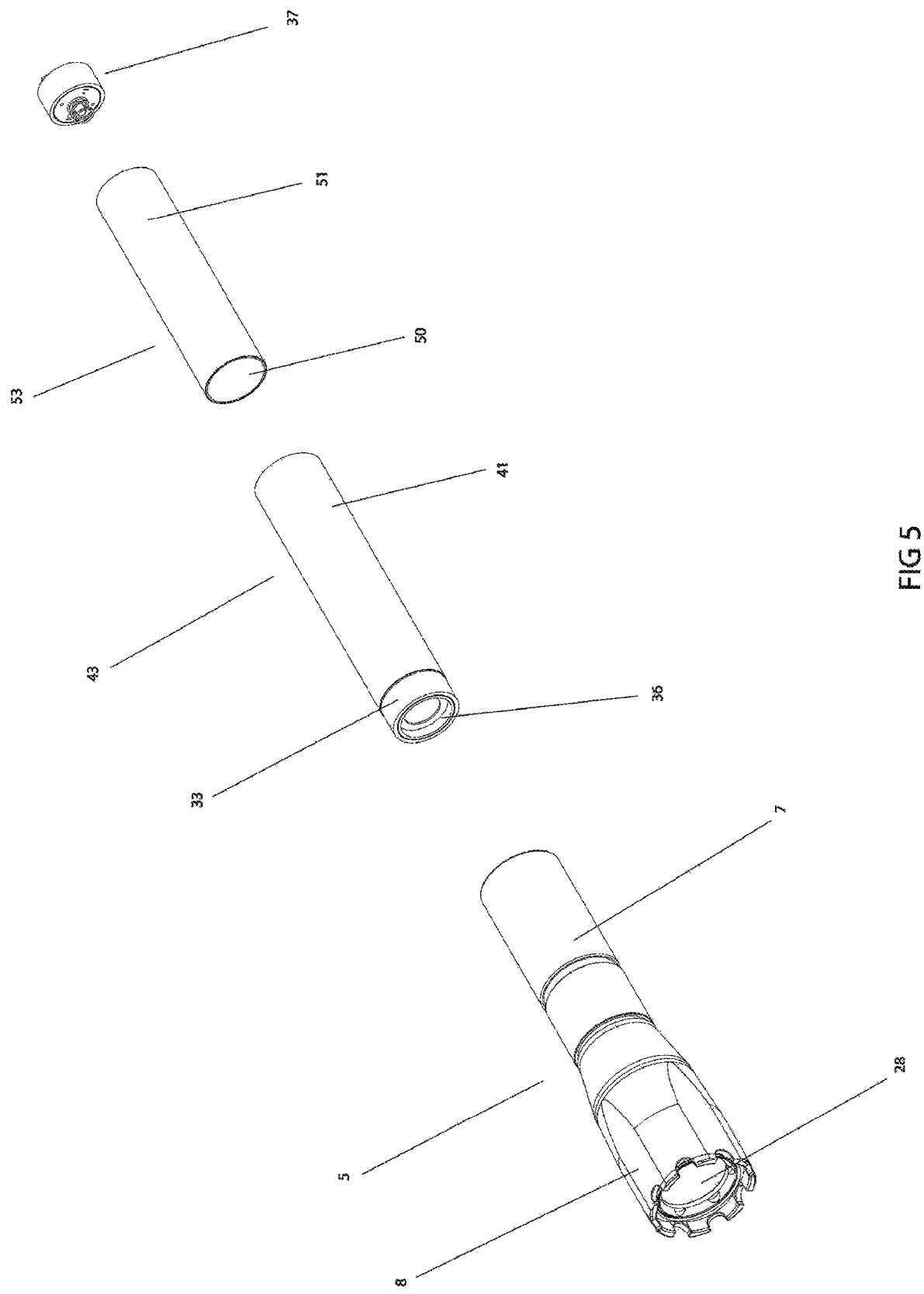
FIG. 5 is an exploded view of an EMP-protected device, according to an embodiment.

With reference to FIG. 5, an exploded view of an EMP protected device 2 is shown, with the exterior housing 5, including the illustrated outer mesh 28, upper housing 8 and lower housing 7. The second layer or housing 43 is made up of illustrated insulator 41, inner mesh 34, reflector insulator 36, and the LED housing 33. In this embodiment, the LED housing 33 can be removed to allow access to the battery 10 by twisting with use of the second layer locking mechanism 42. The battery 10 and associated switch assembly 37 are located within the third layer or housing 53. This third layer or housing 53 includes a metal interior tube 50 and insulator 51. The third housing 53 fits within the second housing 43.

Figure 6:
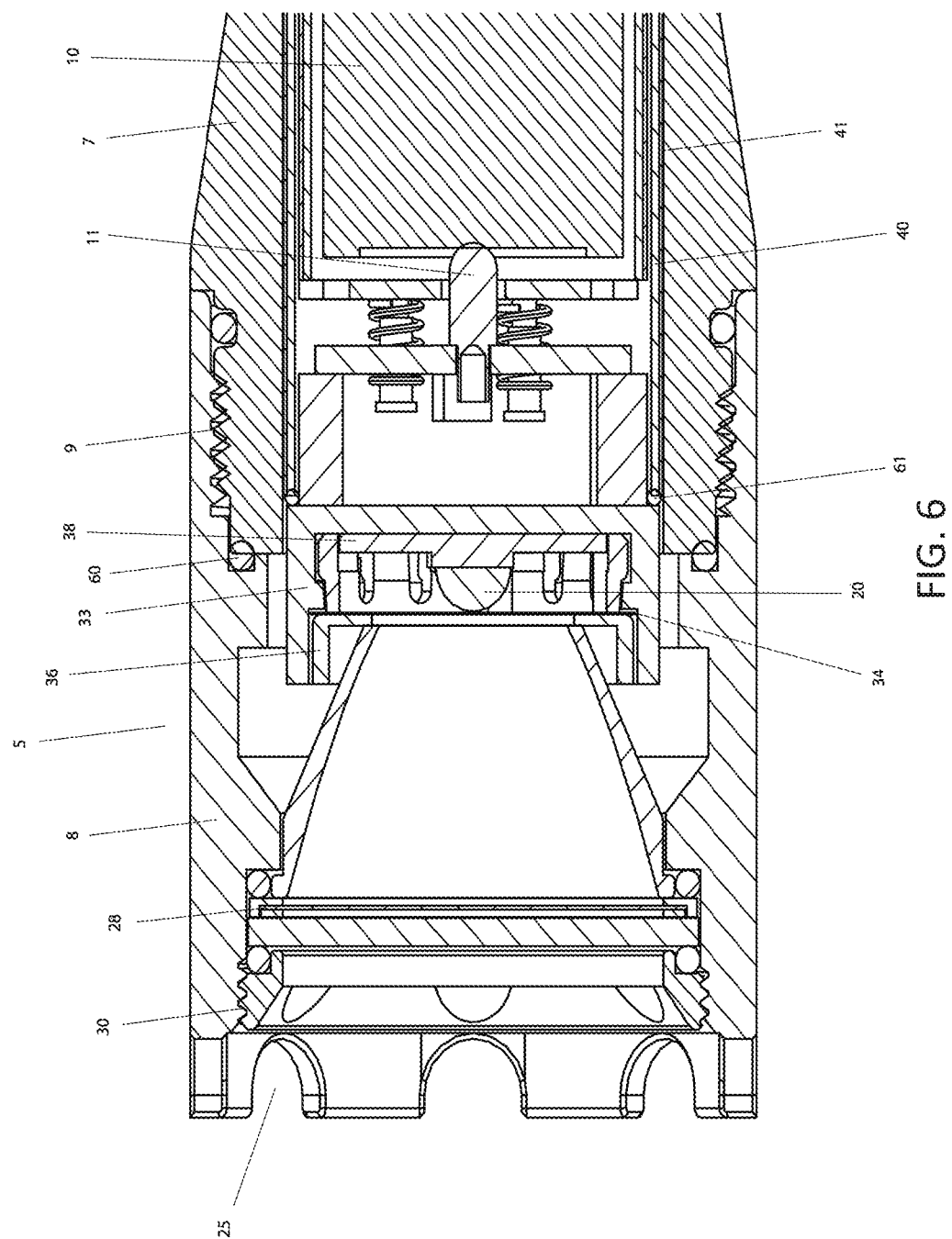
FIG. 6 is detail view of the upper (outer) housing of an EMP-protected device, according to an embodiment.

With reference to FIG. 6, it shows a more detailed view of the upper housing 8, having an opening 25 at the end, wherein the mesh disk 28 is removably mounted by threading 30. The upper housing 8 is connected to lower housing 7 conductively by threading 9 and EMI gasket 60. The battery 10 is shown electrically connected to the light source 20 through light source circuits 38 using battery contact 11. The second housing metal tube 40 completes its housing enclosure by contacting the led metal housing 33 through EMI gasket 61 and with the internal mesh 34. These parts are insulated from the exterior housing 5 by insulators 36 and 41.

With reference to FIG. 7, traditional circuitry design does not account for protection from an attack of very short pulses of high intensity. One way to offer such protection is through the addition of a transient voltage-suppression (TVS) diode or thyristor and a very small capacitor across a power supply, and other areas of potentially greater threat or weakness. This combination can act as a circuit or component bypass filter in case of a very short pulse. In an embodiment, the circuits are separated into a head and a tail.

MIL Standard 461 provides radiated (RS 105) test methods and test levels for determining a device's immunity to EMP. The coupling modes into the equipment disclosure and its interconnecting cabling can be complex and may be evaluated separately. RS 105 test method addresses the risk of radiated exposure to an EMP event. Testing is generally applicable to equipment installed in exposed and partially exposed environments on aircraft, surface ships, submarines and ground vehicles. These testing methods can provide simulation of some of the potential EMP conditions which the various embodiments described herein attempt to manage.

Figure 8:
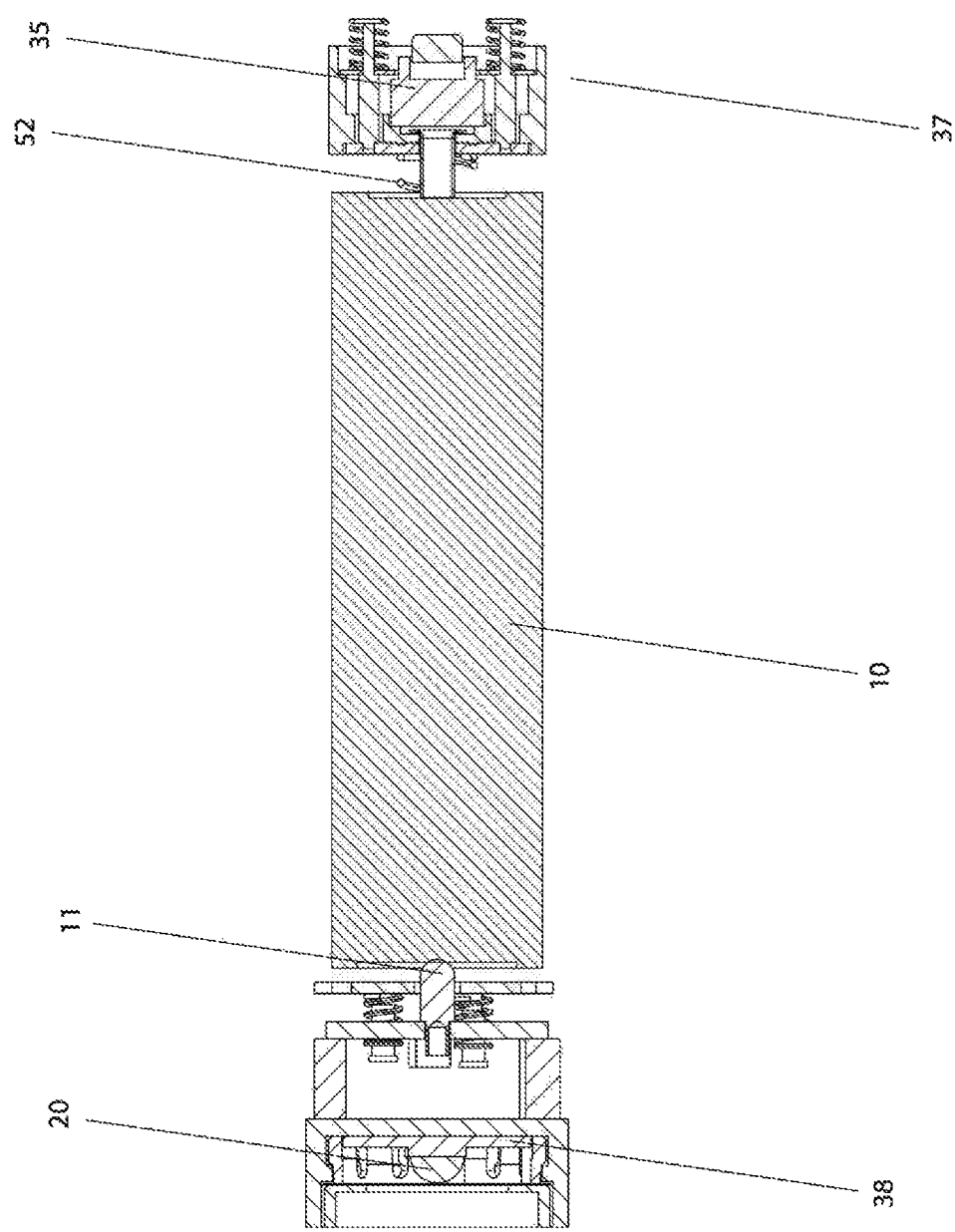
FIG. 8 shows a cross-sectional view of a EMP-protected device, in accordance with an embodiment.

With reference to FIG. 8, a cross-section of an embodiment of an Electronic Susceptibility Protection of an EMP-protected electronic device 2 is shown, in this embodiment, a flashlight. This includes the light source 20 connected to a circuit board 38. The circuit board 38 is electrically connected to the battery 10 by a contact point 11. The battery connects electrically to the switch assembly 37 by the contact spring 52 connected to the switch 35.

Figure 9:
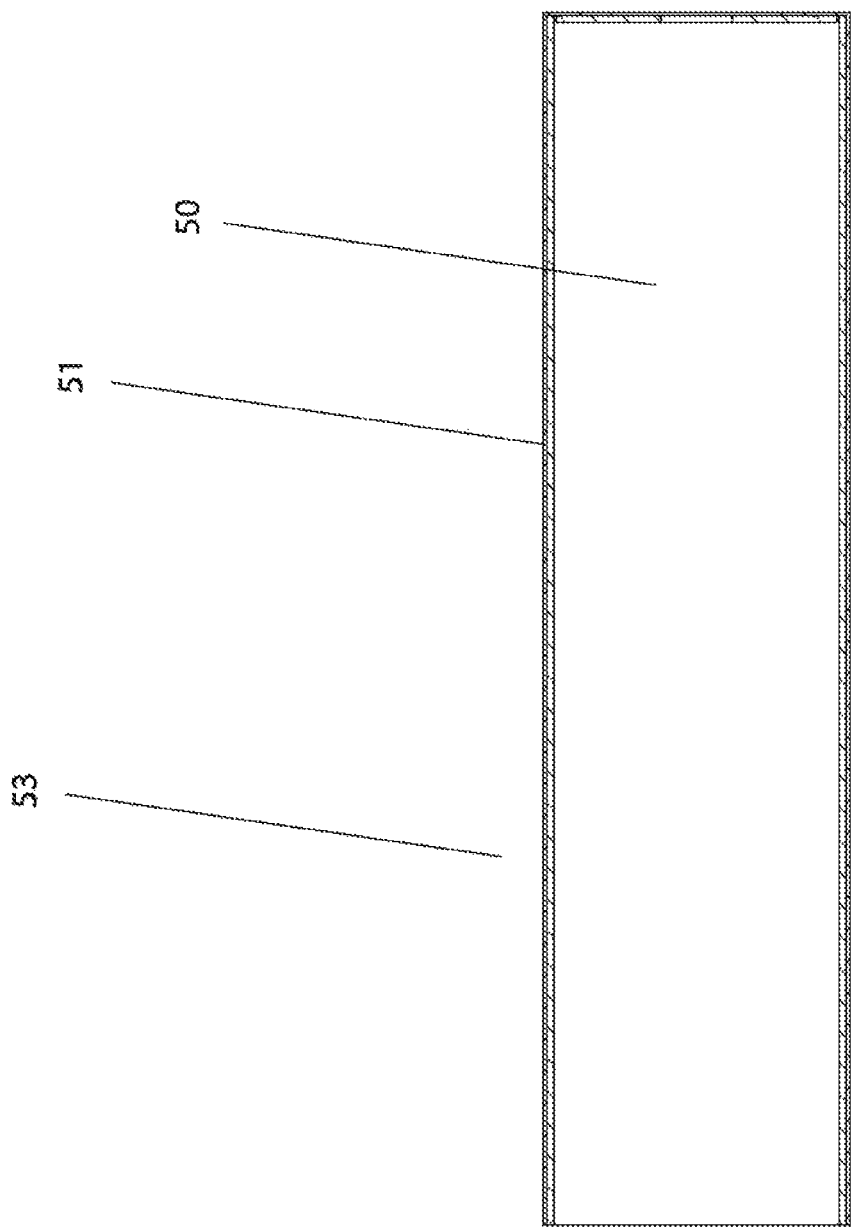
FIG. 9 is a cross section view of a layer of an EMP-protected device, according to an embodiment.

With reference to FIG. 9, a cross-section of a third layer or housing (advanced protection) 53 of an EMP-protected electronic device 2 includes a metal enclosure 50 insulated by an outer layer 51 from other housings or layers of protection.

Figure 10:
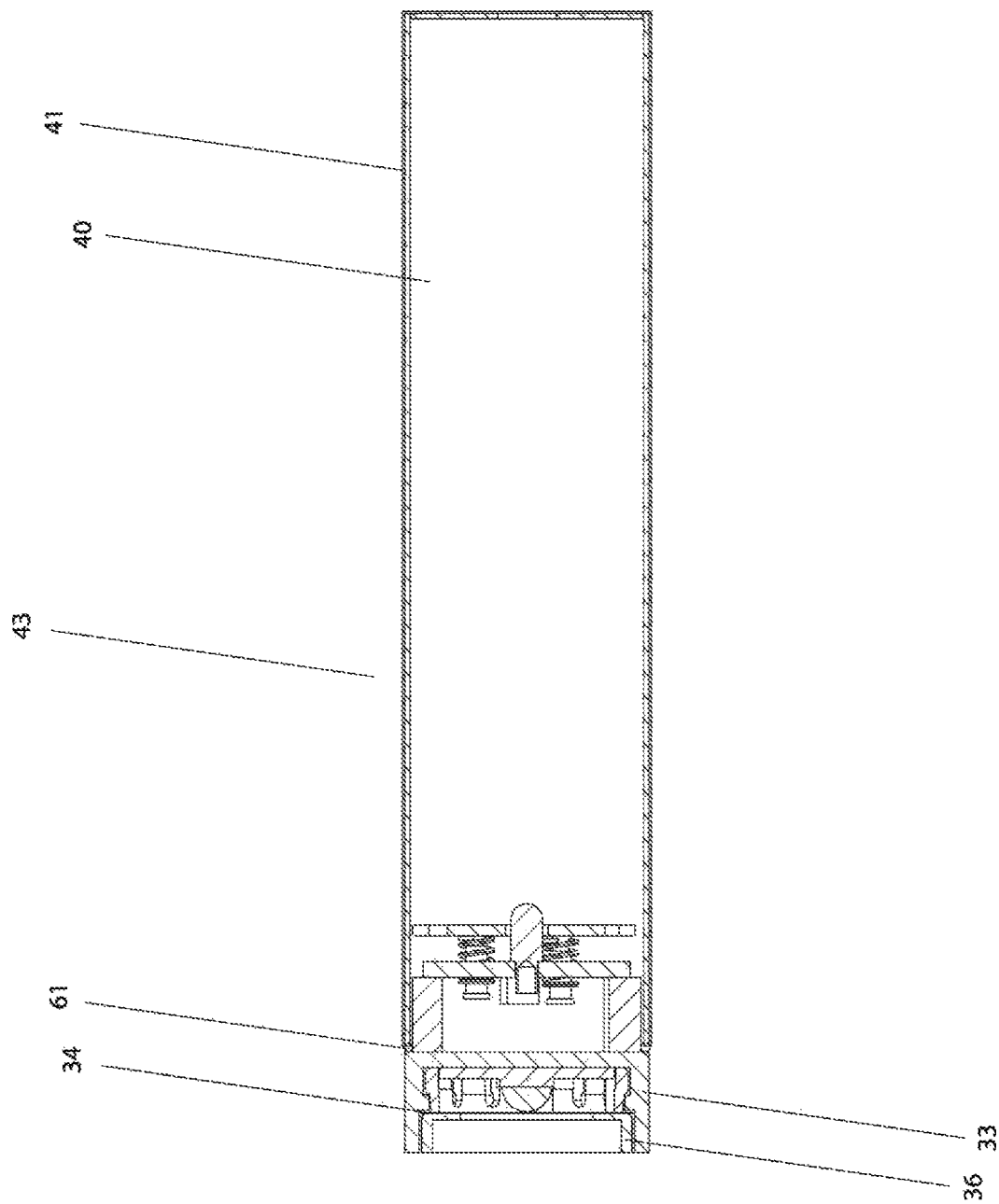
FIG. 10 is a cross section view of a further layer of an EMP-protected device, according to an embodiment.

With reference to FIG. 10, a cross-section of the second layer or housing (intermediate protection) 43 of an EMP-protected electronic device 2 is provided. Device 2 includes metallic electrically conductive materials with a lower housing 40, an upper metallic LED housing 33, and an inner mesh layer 34. Layer 34 includes a mesh of stainless steel (or other conductor), electrically connected throughout the mesh, without substantial gaps, but insulated from the electrical components of the device. Without limiting the disclosure of other embodiments, in an embodiment, the inner mesh layer 34 may include stainless steel mesh at 50×50 openings per square inch, with an opening size of 0.0188 in, and wherein the overall thickness is 0.0024 in, given an open area percentage of 88% which does not significantly diminish emanating light. An insulating layer 36 separates the mesh layer 34 from metallic reflector 21 (shown in FIG. 4) of the exterior housing 5. Both the upper and lower housings are electrically connected by an EMI gasket 61 of similar makeup to the gasket 60 of FIG. 4 which is part of the exterior housing. The lower metallic housing 40 is insulated from the exterior housing 5 by an insulator 41.

Figure 11:
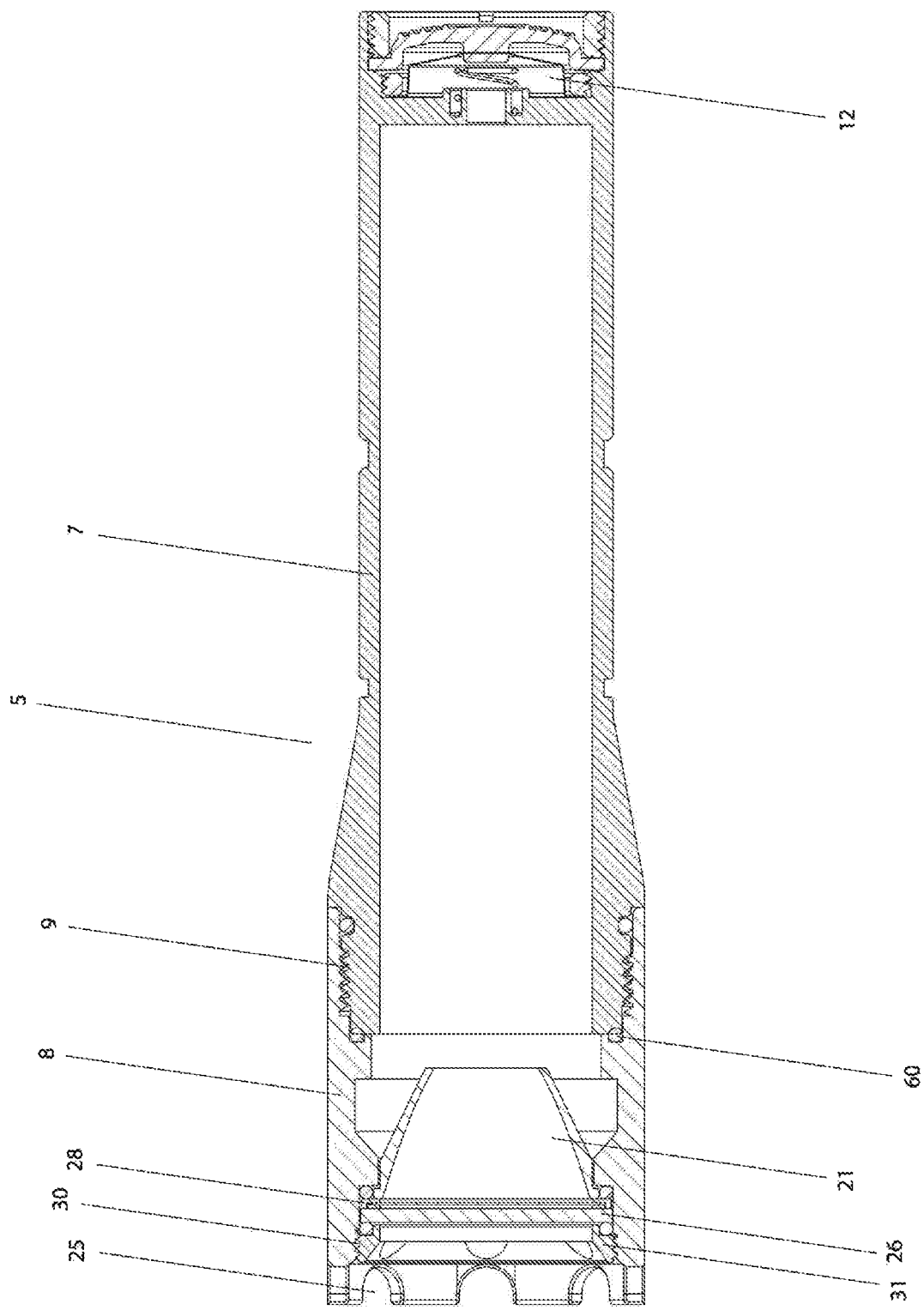
FIG. 11 is a cross section view of a layer of an EMP-protected device, according to an embodiment.

With reference to FIG. 11, the external housing components are being shown. The protection provided by this invention, in the embodiment shown has an external housing 5, made up of the lower housing 7, protected in the rear opening by rear barrier seal 12, connecting to upper housing 8, via threads at continuous connection surface 9, and sealing the enclosure through EMI gasket 60. The opening 25 is protected by outer mesh disk 28, which connects to upper housing 8, and is secured to the housing by lens bezel 31 with threads 30. Note that mesh disk 28 is protected from exterior damage by glass or plastic lens 26. In this embodiment, additional protection was provided by an aluminum reflector 21 which connects to both the mesh disk 28 and the upper housing 8.

Figure 12:
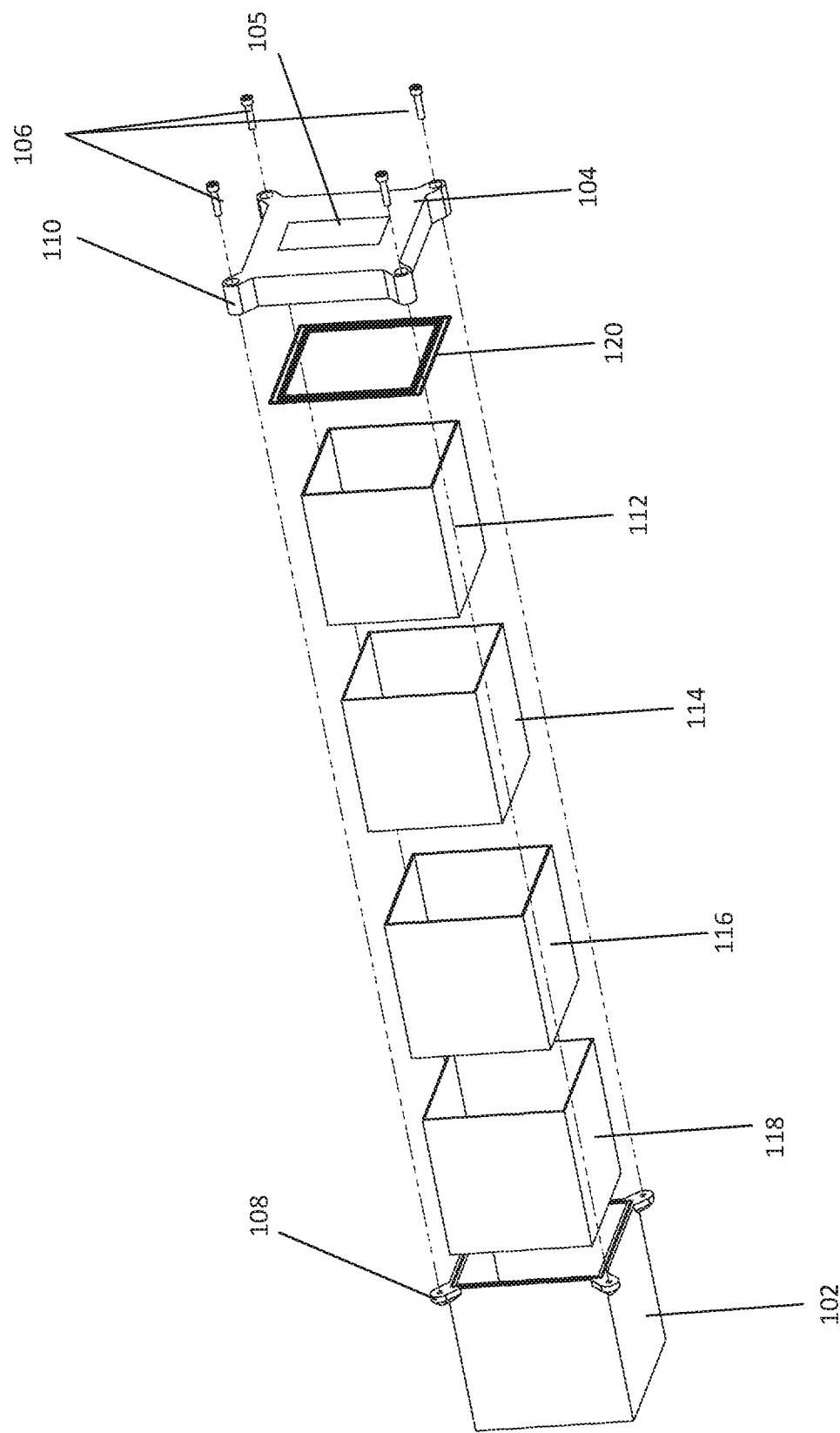
FIG. 12 is an exploded view of an EMP-protected case, according to an embodiment.

With reference to FIG. 12, an EMP-resistant case 100 is shown, having a plurality of layers, that fit within one another to form a case. There is an outside housing 102, in this case box-shaped, but any container shape may be used, and a lid 104 that connects to the housing 102 to close the housing using one or more fasteners 106 (in this embodiment screws). In this embodiment, there are four interior nested boxes or layers, from smallest to largest 112, 114, 116 ad 118, that fit within each other, the largest box 118 fitting within the housing 102. Conductive layers alternate with insulation layers. In an embodiment, layers boxes 114 and 118 are formed of insulating material to insulate between conductive layers 112, 116 and housing 102 (in an embodiment). In such an embodiment, the lid 104 is electrically connected with the housing 102, and each of the nested boxes 112 and 116 have corresponding layers within the lid, to which they are removably electrically connected, and insulative layers 114 and 118 have corresponding layers within the lid, to which they are removably connected enabling the lid to be removable. Due to the insulation between the conductive layers, a capacitance is caused which absorbs the EMP pulse (high permittivity).

In an embodiment, a gasket 120 fits between the housing 102 and the lid 104. The gasket is electrically conductive and allows the exterior conductive layer to communicate electric charge between the housing 102 and the lid 104. The insulation layers have no gasket. The gasket 120 helps prevent the leakage of EMP energy from one layer to another, and act in a similar manner to environmental gaskets however for electromagnetic energy.

In an embodiment, the lid 104 has a window 105, including a first interior layer of glass or translucent plastic, and a second exterior layer of glass or translucent plastic, and one or more of the layers 112 and 116 passing through between the translucent layers. In an embodiment, a mesh passing through between the layers electrically connects the conductive lid 104. In an embodiment where mesh of several layers, for example 104, 112 and 116 pass between the interior and exterior layers of plastic, additional layers of translucent plastic may be used as insulators to separate the conductive layers 104, 112 and 116 while maintaining translucency so that a user can view the contents of the box without opening it. The window also has the benefit of protecting the mesh of each layer 112 and 116, for example, from tearing or damage.

In an embodiment, the number of layers (formed by nested boxes) of conductive alternating with insulation layers may be any number. In an embodiment, the interior layer is insulative (so as to prevent passing a current to an electronic device within the case). In a preferred embodiment, the most exterior layer (housing 102) is conductive. The embodiment shown has three distinct layers, and if a fourth layer was added, a further insulative layer between 112 and the inside conductive layer (forming the 4th layer) would be included.

In an embodiment, boxes, 102, 112 and 116 are metallic or conductive boxes. Box 112 may be a stainless steel material or mesh, box 116 may be stainless steel or aluminum, and the housing 102 is aluminum. The materials may be varied to provide a particular EMP absorption profile. The related lid layers (not shown) have the corresponding material when meeting the lower box 112, 116, and these layers are insulated from each other. Boxes 114 and 118 are made of an insulative material such as plastic to isolate the conductive layers from one another, wherein each layer attenuates and absorbs the energy from the EMP.

Figure 13:
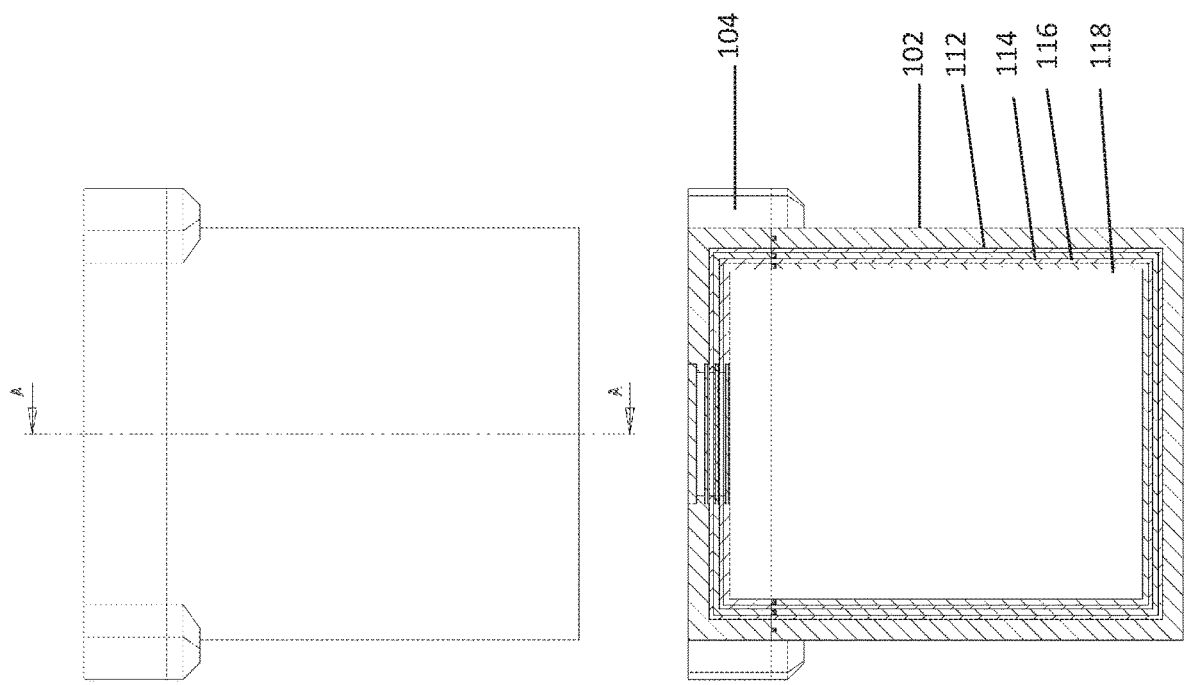
FIG. 13 is a cross-sectional view of an EMP-protected case, according to an embodiment.

With reference to FIG. 13, a cross-section of the EMP-resistant case is shown, showing the outside housing 102, wherein the lid 104 fits over and connects with the housing 102. In an embodiment, the lid 104 is connected to the housing 102 by fasteners 106, such as screws. The nested boxes 112, 114, 116 and 118 fit within each other, and within the housing 102. The layers created by the boxes alternate between conductive material and insulation material. In so doing, a dielectric is created between the layers to absorb the EMP energy. In an embodiment, the housing 102, and layers 116 and 112 are conductive, with the intermediate layers insulative.

Figure 14:
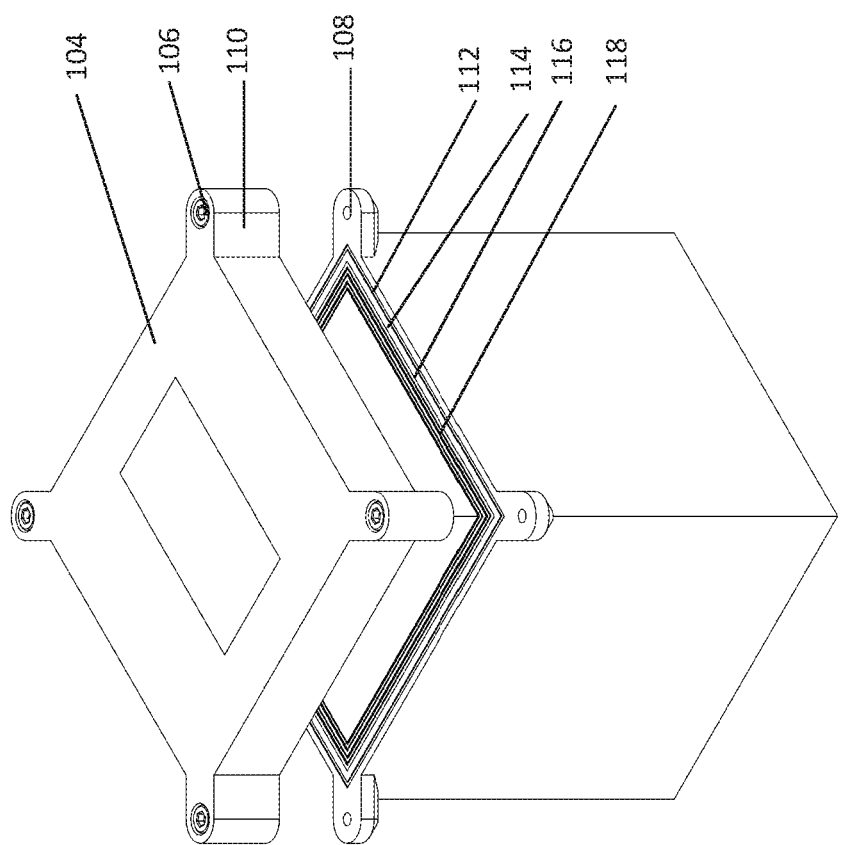
FIG. 14 is a perspective view of an EMP-protected case, according to an embodiment.

With reference to FIG. 14, a perspective view is shown, wherein the lid 104 fits on the housing 102, wherein in an embodiment the housing 102 has edge mounts 108, which match with corresponding lid edge mounts 110, wherein the fastener may connect the lid 104 and housing 102 through the mounts 108, 110.

When sold assembled, each box includes a housing and a lid, wherein the conductive and insulation layers are pre-assembled and essentially permanently set into place within the housing. A user receives the housing, lid and fasteners, which one could use to close the box. The gasket 120 may be essentially permanently bonded to the edge of the lid, wherein it closes with the lid on the housing 102.

The invention has been described herein using specific embodiments for the purposes of illustration only. It will be readily apparent to one of ordinary skill in the art, however, that the principles of the invention can be embodied in other ways. Therefore, the invention should not be regarded as being limited in scope to the specific embodiments disclosed herein, but instead as being fully commensurate in scope with the following claims.

What is claimed is:

1. An EMP-resistant (electromagnetic pulse resistant) case for portable devices, comprising:
    an upper housing and a lower housing connected by a continuous connection surface, wherein the lower housing and the upper housing each comprise:
        a first exterior electrically conductive layer,
        a first insulative layer disposed on an inside of the first exterior electrically conductive layer,
        a second electrically conductive layer disposed on an interior of the first insulative layer,
        a second insulative layer disposed on an interior of the second electrically conductive layer, and
        a third conductive layer having a third insulative layer disposed on an interior of the third conductive layer;
    wherein the first insulative layer is sandwiched between the first and second electrically conductive layers, the first insulative layer configured to maintain electrical separation between the first and second electrically conductive layers; and
    further wherein the third insulative layer is sandwiched between the second and third electrically conductive layers, the third insulative layer configured to maintain electrical separation between the second and third electrically conductive layers.

2. The EMP-resistant case of claim 1 wherein part or all of the first conductive layer, second conductive layer, third conductive layer, or a combination thereof of the lower housing and upper housing is formed of a mesh.

3. The EMP-resistant case of claim 1 wherein the continuous connection surface is a threaded connection including a mechanical and an electrical connection between the first through third conductive layers.

4. The EMP-resistant case of claim 1 wherein the upper housing comprises a light source and wherein part or all of the upper housing includes a single layer of mesh over the light source, the mesh configured to permit transmission of light from the light source and receiving an EMP pulse.

5. The EMP-resistant case of claim 1 further comprising one or more transient voltage suppression (TVS) diodes and/or thyristors and a capacitor, the one or more transient voltage suppression diodes and/or thyristors and the capacitor each electrically connected to at least one of the first through third conductive layers.

6. An EMP-resistant flashlight comprising:
    an external housing having an upper housing and a lower housing, the upper housing and lower housing each comprising:
        a first exterior electrically conductive layer,
        a first insulative layer disposed on an interior of the first exterior electrically conductive layer,
        a second electrically conductive layer disposed on an interior of the first insulative layer,
        a second insulative layer disposed on an interior of the second electrically conductive layer,
        a third electrically conductive layer disposed on an interior of the second insulative layer, and
        a third insulative layer disposed on an interior of the third electrically conductive layer;
    a continuous connection surface coupled to each of the upper housing and the lower housing; and
    a light source coupled to the upper housing;
    wherein the first insulative layer is sandwiched between the first and second electrically conductive layers, the first insulative layer configured to maintain electrical separation between the first and second electrically conductive layers; and
    further wherein the third insulative layer is sandwiched between the second and third electrically conductive layers, the third insulative layer configured to maintain electrical separation between the second and third electrically conductive layers.

7. The EMP-resistant flashlight of claim 6 wherein part or all of the first conductive layer, second conductive layer, third conductive layer, or a combination thereof comprises a mesh.

8. The EMP-resistant flashlight of claim 6, wherein the continuous connection surface is a threaded connection including a mechanical and an electrical connection between the first through third electrically conductive layers.

9. The EMP-resistant flashlight of claim 6, wherein part or all of the upper housing includes a mesh disposed over the light source, the mesh configured to permit transmission of light from the light source and receiving an EMP pulse.

10. The EMP-resistant flashlight of claim 6, further comprising one or more transient voltage suppression (TVS) components and a capacitor, the one or more transient voltage suppression components and the capacitor each electrically connected to at least one of the first through third conductive layers.

* * * * *